United States Patent
Dickey et al.

(10) Patent No.: US 10,779,430 B2
(45) Date of Patent: Sep. 15, 2020

(54) MULTILEVEL HIERARCHICAL ARCHITECTURE FOR POWER DISTRIBUTION SYSTEMS

(71) Applicant: Hamilton Sundstrand Corporation, Charlotte, NC (US)

(72) Inventors: John A. Dickey, Caledonia, IL (US); Terrence R. Leibham, St. Charles, IL (US)

(73) Assignee: Hamilton Sundstrand Corporation, Charlotte, NC (US)

(*) Notice: Subject to any disclaimer, the term of this patent is extended or adjusted under 35 U.S.C. 154(b) by 334 days.

(21) Appl. No.: 15/846,754

(22) Filed: Dec. 19, 2017

(65) Prior Publication Data
US 2019/0191586 A1    Jun. 20, 2019

(51) Int. Cl.
| | |
|---|---|
| H05K 7/14 | (2006.01) |
| H02J 4/00 | (2006.01) |
| B64D 41/00 | (2006.01) |
| H02J 13/00 | (2006.01) |

(52) U.S. Cl.
CPC ......... *H05K 7/1457* (2013.01); *B64D 41/00* (2013.01); *H02J 4/00* (2013.01); *H02J 13/00* (2013.01); *B64D 2221/00* (2013.01)

(58) Field of Classification Search
None
See application file for complete search history.

(56) References Cited

U.S. PATENT DOCUMENTS

| | | | |
|---|---|---|---|
| 5,343,406 A * | 8/1994 | Freeman | H03K 19/1736 326/40 |
| 6,856,045 B1 | 2/2005 | Beneditz et al. | |
| 7,142,953 B2 | 11/2006 | Marshall et al. | |
| 7,568,085 B2 | 7/2009 | Ramesh | |
| 8,209,470 B2 | 6/2012 | Mamontov | |
| 9,327,600 B1 * | 5/2016 | Nehmeh | B60L 1/00 |
| 10,531,587 B2 * | 1/2020 | Compton | B64D 35/08 |

(Continued)

FOREIGN PATENT DOCUMENTS

| | | |
|---|---|---|
| CN | 102224655 | 10/2011 |
| EP | 2533399 | 12/2012 |

(Continued)

OTHER PUBLICATIONS

European Search Report for European Patent Application No. 18214133 completed Jan. 21, 2019.

*Primary Examiner* — Jared Fureman
*Assistant Examiner* — Joel Barnett
(74) *Attorney, Agent, or Firm* — Carlson, Gaskey & Olds, P.C.

(57) ABSTRACT

A power distribution assembly according to an example of the present disclosure includes, among other things, a housing at least partially receiving a plurality of hardware modules coupled to a backplane, the plurality of hardware modules including at least one output module and a communications module that communicates information between the plurality of hardware modules and a second power distribution assembly. At least one hardware module of the plurality of hardware modules includes a field programmable gate array that commands the at least one output module to selectively power at least one aircraft system. A method of operation of a power distribution system is also disclosed.

15 Claims, 7 Drawing Sheets

(56) References Cited

U.S. PATENT DOCUMENTS

2012/0259583 A1    10/2012   Noboa et al.
2017/0101067 A1*   4/2017   Carleial ................ B60R 16/023
2017/0203705 A1    7/2017   Fritz et al.
2018/0138716 A1*   5/2018   Bailey .................... H02J 13/00

FOREIGN PATENT DOCUMENTS

EP          3154151     4/2017
WO      2017062911     4/2017

* cited by examiner

US 10,779,430 B2

MULTILEVEL HIERARCHICAL ARCHITECTURE FOR POWER DISTRIBUTION SYSTEMS

BACKGROUND

This disclosure relates to a power distribution system for powering a vehicle, and more particularly to a power distribution system having a multilevel hierarchical architecture for powering one or more vehicle components.

Some vehicles such as an aircraft include a power distribution system having a primary power distribution assembly that controls one or more secondary power distribution assemblies to distribute power to aircraft systems onboard the aircraft. Each power distribution assembly may include one or more hardware modules for communicating information with another power distribution assembly and for powering some of the aircraft systems. One or more of the hardware modules may be removable from the power distribution assembly.

Some power distribution systems route all inputs of the power distribution system to the primary power distribution assembly which performs all decisions to command the secondary power distribution assemblies to power the aircraft systems.

SUMMARY

A power distribution assembly according to an example of the present disclosure includes a housing at least partially receiving a plurality of hardware modules coupled to a backplane, the plurality of hardware modules including at least one output module and a communications module that communicates information between the plurality of hardware modules and a second power distribution assembly. At least one hardware module of the plurality of hardware modules includes a field programmable gate array that commands the at least one output module to selectively power at least one aircraft system.

A power distribution system for an aircraft according to another example of the present disclosure includes at least one primary power distribution assembly and a plurality of secondary power distribution assemblies coupled to the at least one primary power distribution assembly and to a plurality of aircraft systems, each of the secondary power distribution assemblies including a plurality of hardware modules, the hardware modules including a communications module, an input module and an output module that selectively powers at least one of the aircraft systems. The power distribution system is arranged according to a communications hierarchy, with the communications module interconnecting the at least one primary power distribution assembly and the hardware modules, and with a discrete set of inputs defined by each input from the plurality of aircraft systems to each input module. A plurality of logical operations that control each output module are allocated to one or more of the hardware modules according to respective inputs of the discrete set of inputs that define each of the logical operations being at a corresponding level in the communications hierarchy.

A method of operation of a power distribution system according to another example of the present disclosure includes communicating information corresponding to a discrete set of inputs defined by a plurality of aircraft systems to a plurality of power distribution assemblies arranged according to a communications hierarchy, and controlling output modules of the power distribution assemblies to selectively power the aircraft systems, with one or more logical operations that control the respective output modules being allocated to one or more hardware modules of the power distribution assemblies according to inputs of the discrete set of inputs that define the one or more logical operations being at a corresponding level in the communications hierarchy.

The various features and advantages of this disclosure will become apparent to those skilled in the art from the following detailed description. The drawings that accompany the detailed description can be briefly described as follows.

BRIEF DESCRIPTION OF THE DRAWINGS

Like reference numbers and designations in the various drawings indicate like elements.

DETAILED DESCRIPTION

This disclosure is directed to a power distribution system defining a multilevel hierarchical architecture that provides power to components or systems including vehicles such as aircraft and other aerospace systems. One or more power distribution assemblies can communicate according to a system or communications hierarchy, with logical operations including decision/utility logic that control the supply of power to one or more loads of the vehicle being allocated at one or more lower levels in the communications hierarchy based upon the availability of inputs to the logical operations being at the respective levels. Some hardware modules include one or more field programmable gate arrays (FPGAs) that execute the logical operations, which can reduce processing and computational demands at relatively higher levels in the communications hierarchy. These and other features are described in additional detail herein.

Figure 1:
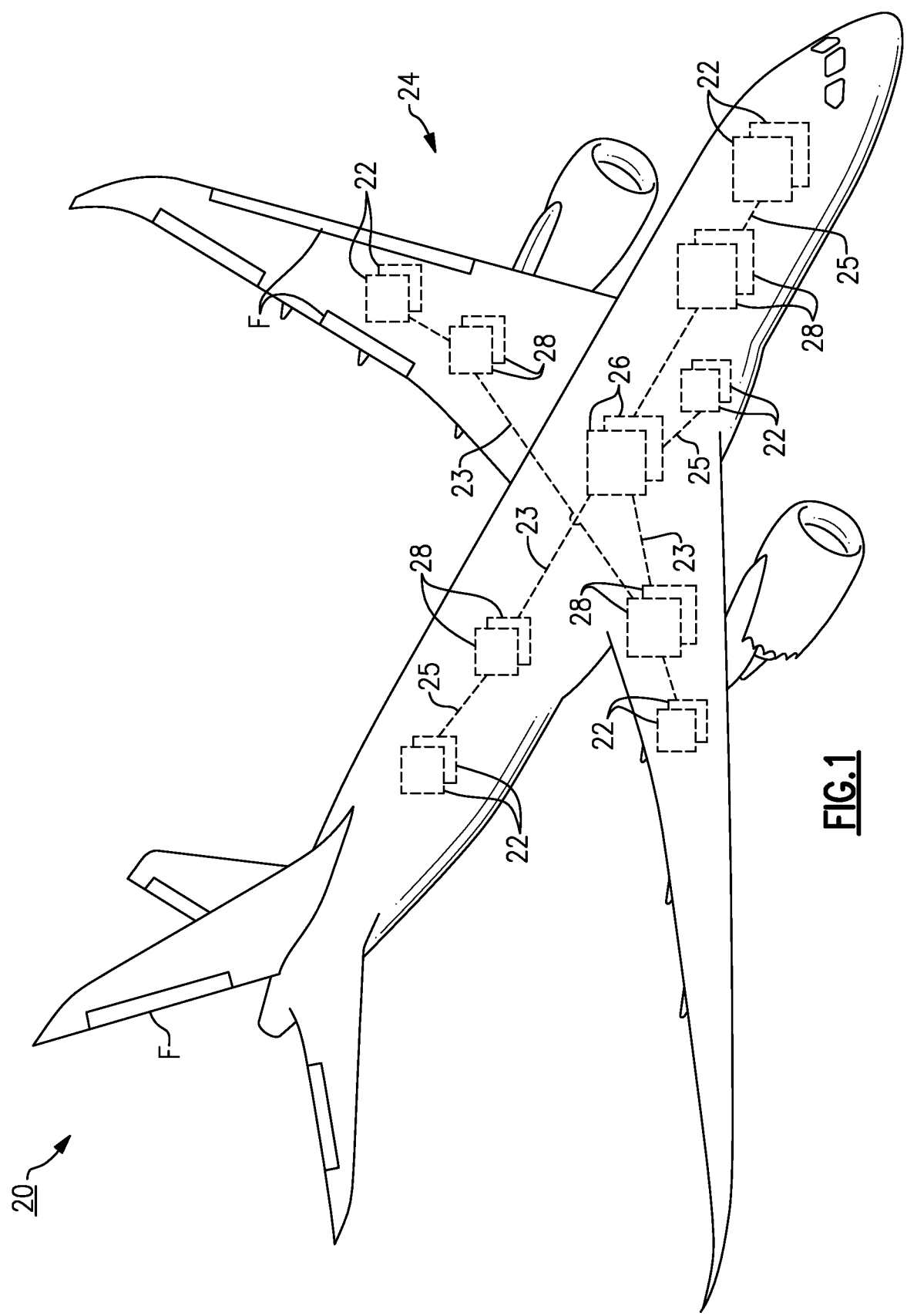
FIG. 1 illustrates an aircraft system according to an embodiment.

FIG. 1 illustrates a vehicle or aircraft 20 according to an embodiment. The aircraft 20 includes a plurality of vehicle or aircraft systems 22 distributed at various discrete locations of the aircraft 20. The aircraft systems 22 provide functionality to operate and control the aircraft 20. Example aircraft systems 22 can include avionics systems, cockpit, visualization and display systems, communications and navigation systems, and actuation systems that control or modulate one or more pumps or mechanical loads such as pivotable flaps F to maneuver the aircraft 20. Other example aircraft systems 22 can include engine and fuel systems, electrical and auxiliary power systems, environment control systems (ECS), fire protection systems, galley control systems, lighting systems, water and waste systems, landing gear systems, diagnostics systems, and other known systems, for example. Although the teachings herein primary refer to an aircraft, other vehicle systems can benefit from the teachings herein, including other aerospace systems such as space vehicles and satellites, ground-based vehicles and power generation systems, and marine systems.

The aircraft 20 incorporates a power distribution system 24 operable to selectively provide power and/or control to one or more loads of the aircraft 20, including one or more of the aircraft systems 22. The power distribution system 24 includes at least one primary (or master) power distribution assembly 26 (hereinafter "primary assembly") coupled to at least one secondary (or satellite) power distribution assembly 28 (hereinafter "secondary assembly"). The primary assembly 26 includes logic to control the secondary assembly 28 to selectively power or control one or more aircraft systems 22 allocated to the secondary assembly 28.

In the non-limiting embodiment of FIG. 1, the power distribution system 24 is a distributed system or architecture including a plurality of primary assemblies 26 coupled to a plurality of secondary assemblies 28 via one or more communications lines 23. The secondary assemblies 28 can be remotely located from each other and/or from each primary assembly 26. In some embodiments, the power distribution system 24 includes one or more assemblies 26/28 that are standalone and do not control, or are not controlled by, another assembly 26/28. The selective powering or control of each of the aircraft systems 22, or components thereof, can be allocated among the assemblies 26/28 to provide a distributed solution.

The assemblies 26, 28 are coupled to one or more aircraft systems 22 via communications lines 25 to selectively power or control one or more of the aircraft systems 22. Each communication line 23, 25 can carry one or more signals including control signals, data and/or current for selectively powering or controlling one or more components of the aircraft systems 22, for example. Each communication line discussed herein can be a single physical line or pathway or a plurality of pathways such as two or more bundled lines or cables.

Each secondary assembly 28 can be controlled by at least one of the primary assembly 26 to selectively power the aircraft systems 22. One or more secondary assemblies 28 can control another secondary assembly 28 to selectively power one or more of the aircraft systems 22.

Figure 2:
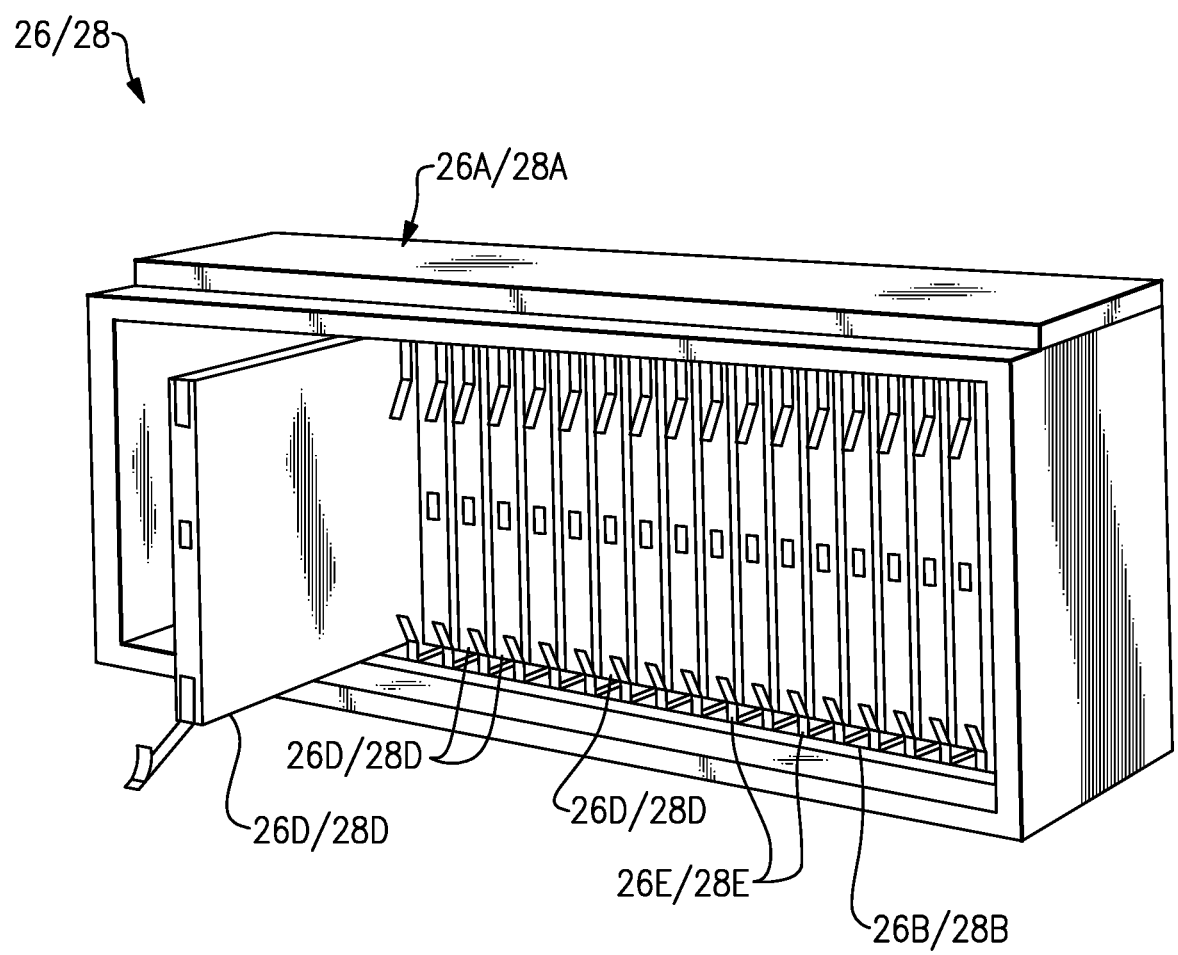
FIG. 2 illustrates a perspective view of a power distribution assembly according to an embodiment.
Figure 3:
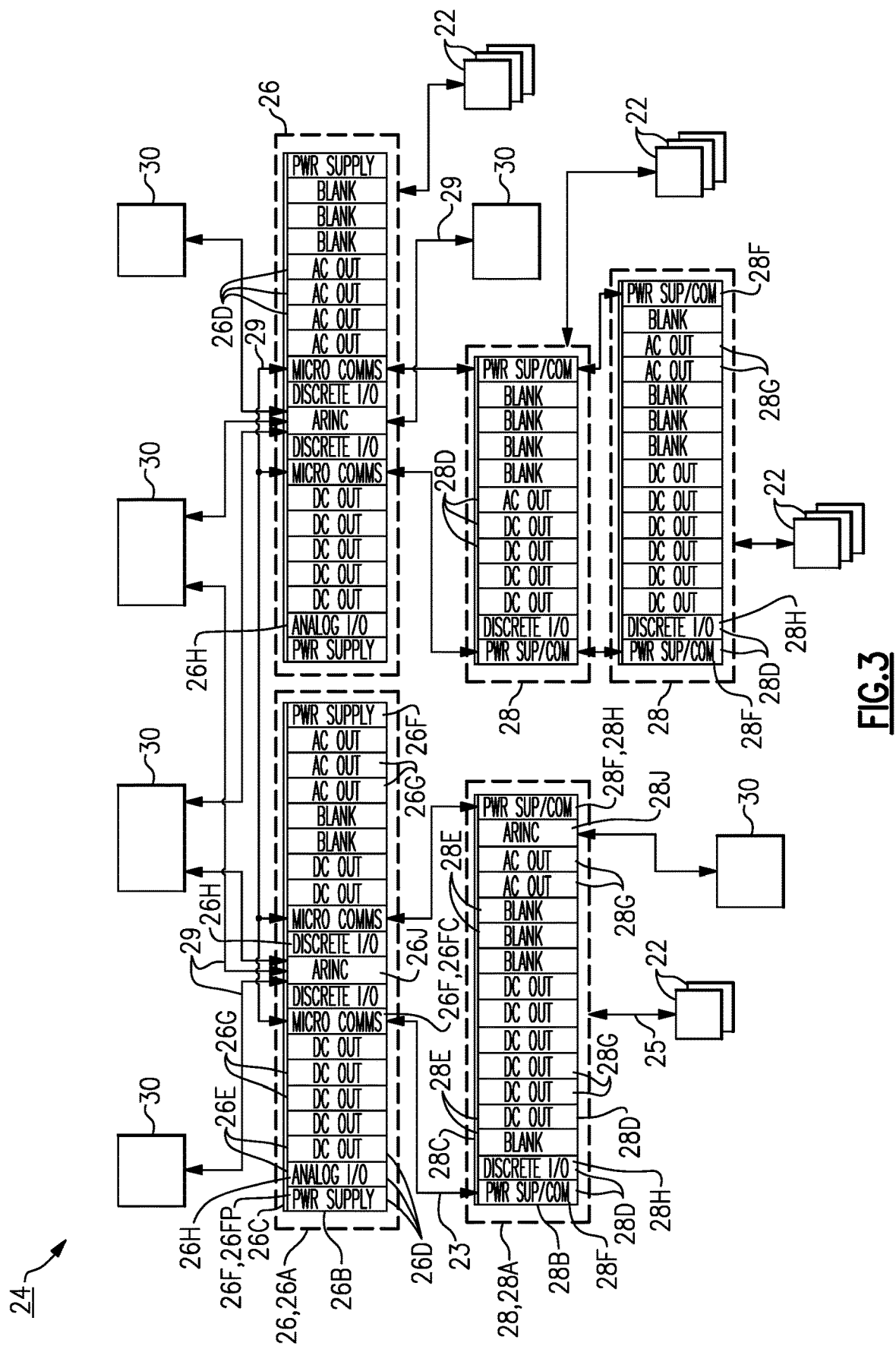
FIG. 3 illustrates a power distribution system according to an embodiment.

FIG. 2 illustrates a perspective view of an example assembly 26/28. Each assembly 26/28 includes a housing 26A/28A that at least partially receives a chassis 26B/28B and a common backplane 26C/28C (FIG. 3). The backplane 26C/28C can be mounted to the chassis 26B/28B. Each hardware module 26D/28D can be at least partially received in the housing 26A/28A including a respective slot 26E/28E of the chassis 26B/28B. Some of the slots 26E/28E can be unoccupied during operation to provide a scalable solution. The common backplane 26C/28C can selectively receive and directly couple together a plurality of the hardware modules 26D/28D to establish connectivity for communicating data and other electrical signals such as a current supply during operation. For the purposes of this disclosure, the term "backplane" means a group of electrical connectors or sockets in parallel with each other to form an electrical bus which additional electronic devices can be plugged into.

As shown, the assembly 26/28 includes hardware modules 26D/28D that are selectively installed or otherwise at least partially received within chassis 26B/28B. Each of the hardware modules 26D/28D can be configured as a line replaceable module (LRM) selectively installed in and removed from one of the slots 26E/28E. Each LRM provides a discrete functionality in a removable hardware device. For the purposes of this disclosure, a line replaceable module (LRM) is a modular component that is designed to be replaced at an operating location of the unit or system incorporating the component, and typically requires few or no tooling to conduct the replacement. Example LRMs can include single board computers or other circuit cards including a connector received in a socket coupled to common backplane 26C/28C (FIG. 3). Each assembly 26/28 can be configured as a line replaceable unit (LRU) comprising one or more LRUs. It should be appreciated, however, that the teachings herein are not limited to an LRU/LRM-based architecture.

Referring to FIG. 3, with continued reference to FIGS. 1 and 2, the power distribution system 24 is shown. For illustrative purposes, power distribution system 24 is shown in FIG. 3 including two primary assemblies 26 and three secondary assemblies 28 arranged in a multilevel hierarchical architecture to selectively power to the aircraft systems 22. Fewer or more than two primary assemblies 26 and three secondary assemblies 28 can be utilized in accordance with the teachings herein.

Example hardware modules 26D/28D of the assemblies 26/28 can include one or more power supply and communications (PSCOMMS) modules 26F/28F operable to receive incoming power and distribute power to one or more output modules 26G/28G to selectively power or control the respective aircraft system(s) 22. The output modules 26G/28G are operable to selectively provide DC and/or AC current to one or more aircraft systems 22.

The PSCOMMS modules 26F/28F interconnect and are operable to route data and other information between the hardware module(s) 26D/28D and other assemblies 26, 28. In other embodiments, the functionality of the PSCOMMS modules 26F/28F including power supply and communications routing can be provided by two separate and distinct hardware modules 26D/28D. In the illustrated embodiment of FIG. 3, the PSCOMMS modules 26F/28F of the primary assembly 26 include separate power supply modules 26FP and communications and control modules 26FC.

Other example hardware modules 26D/28D include one or more input/output (I/O) modules 26H/28H for receiving and sending one or more electrical signals, such as discrete and analog data or other information, to one or more of the aircraft systems 22 and/or other components of the aircraft 20. Other example hardware modules 26D/28D include other communication modules, such as Aeronautical Radio, Inc. (ARINC)-compliant modules 26J/28J, for communicating or otherwise receiving and sending signals to various components including other assemblies 26, 28 and aircraft and control systems 22, 30.

The ARINC modules 26J/28J of each assembly 26, 28 can be coupled to one or more control systems 30 via one or more communications lines 29. The control systems 30 can be arranged at various locations of the aircraft 20 and can include an interface and logic to control the aircraft systems 22, including causing the power distribution system 24 to selective power the aircraft system(s) 22 during operation of the aircraft 20. For example, the control systems 30 can include avionics computers and multifunction control display units, and galley control panels engageable by interaction from aircraft operators, crew and other users of the aircraft 20.

Figure 4:
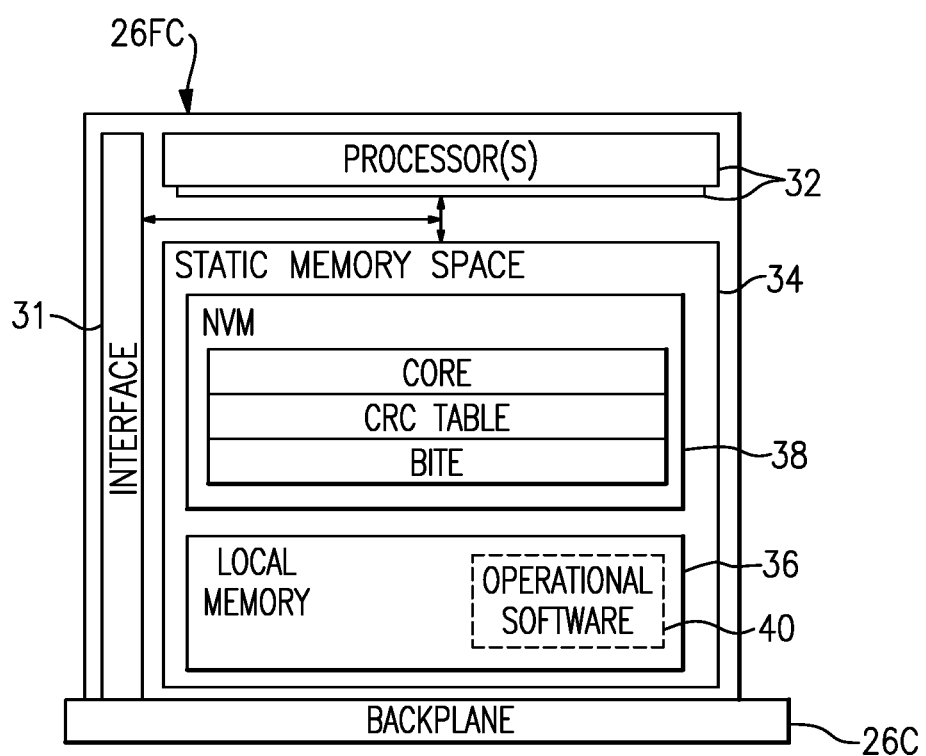
FIG. 4 illustrates a communications module according to an embodiment.

FIG. 4 illustrates the communications and control module 26FC of primary assembly 26 for executing one or more logical operations or decision/utility logic or functions to control or command other hardware modules 26D/28D to selectively power one or more aircraft systems 22, according to an embodiment. One or more features of the control module 26FC can be incorporated into another hardware module 26D/28H, such as one of the PSCOMMS modules 26F/28F, for example.

The control module 26FC includes decision/utility logic to control (and/or be controlled by) other assemblies 26/28 and to control other hardware modules 26D/28D to selectively power or control the aircraft systems 22 (FIG. 3). Each control module 26FC includes memory, an interface 31 and at least one (or only one) processor 32 that can execute one or more instructions including accessing a static memory space 34 to read and/or write data. The processor 32 may, for example only, be any type of known microprocessor (µP) having desired performance characteristics. The control module 26FC can serve as a gateway to control systems 30 of the aircraft 20 and can communicate information on the backplane 26C and through the interface 31.

The static memory space 34 includes a local memory 36 and a non-volatile memory (NVM) 38. The local memory 36 can be a solid-state storage device such as flash memory, for example, or another device that persistently stores data. The local memory 36 is operable to store operational software 40 that is executable by the processor 32 and that corresponds or otherwise relates to discrete, predefined functionality of the control module 26FC to communicate with other assemblies 26/28 and to selectively power or control one or more of the aircraft systems 22.

The operational software 40 can include a discrete set of commands or functions that can be compiled into executable code that can be executed by the processor 32 from the local memory 36, which can include loading one or more instructions of the operational software 40 into read-only memory (ROM) or another memory space, for example. In embodiments, the operational software 40 includes an operating system (OS) including one or more software utilities and applications to provide the desired functionality. The operational software 40 can be stored as an image in memory, for example.

The operational software 40 includes logic that controls specific functionality of the respective aircraft system(s) 22. For example, the operational software 40 can include one or more utilities or functionality for controlling the hardware modules 26D/28D to selectively power or control one or more devices, and communicating with other assemblies 26/28. Example functionality can include communicating data and other information between the control module 26FC and other assemblies 26/28, aircraft systems 22 and/or control systems 30. Other example functionality includes actuating a pump to modulate flow of fuel to an engine, actuating a switch to activate lighting, and providing power to a radio or another communications system in response to system initialization. One would understand how to program the operational software 40 to achieve the desired functionality for selectively powering or controlling the respective aircraft system(s) 22 of the aircraft 20 utilizing the teachings disclosed herein.

NVM 38 can include one or more discrete memory spaces. In the illustrated example of FIG. 4, NVM 38 includes a core space that stores boot and board support package startup fault codes and other board information, and state information of the operational software 40 and/or hardware modules 26D/28D of the assemblies 26/28, for example. NVM 38 includes a memory space for a cyclic redundancy check (CRC) table for sectors of the local memory 36, and a BITE memory space, for example.

Figure 5:
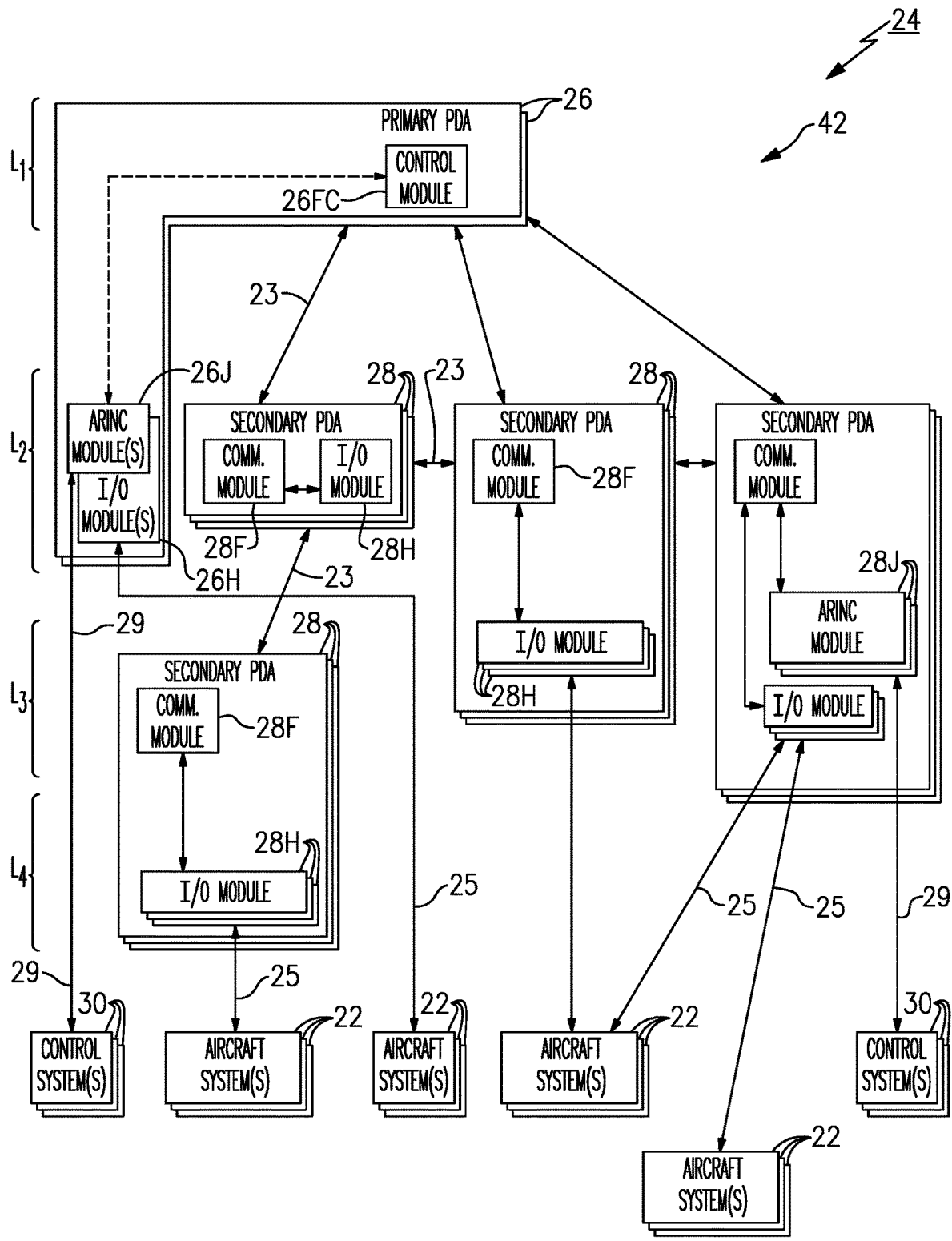
FIG. 5 illustrates a communications hierarchy of the power distribution system of FIG. 3 according to an embodiment.

Referring to FIG. 5, the power distribution system 24 defines or is otherwise arranged according to a multilevel communications hierarchy 42. In the illustrated embodiment of FIG. 5, the communications hierarchy 42 defines four distinct levels including a first (or upper) level L1 and three relatively lower levels including a second level L2, a third level L3 and a fourth level L4, with the first level L1 being an uppermost level, the fourth level L4 being a lowermost level, the second and third levels L2, L3 being lower or intermediate levels. Although four levels are shown, fewer or more than four levels can be utilized with the teachings herein.

The assemblies 26, 28 including the hardware modules 26D, 28D are configured to route data and other information with other assemblies 26, 28 and aircraft and control systems 22, 30 according to the communications hierarchy 42. The aircraft and control systems 22, 30 define a discrete set of inputs introduced at or directly communicated to respective I/O modules 26H/28H and ARINC modules 26J/28J at one or more lower levels L2-L4 of the communications hierarchy 42. The power distribution system 24 is defined by the discrete set of inputs, which includes an entirety of the inputs communicated to the power distribution system 24, and with subsets of the inputs introduced or directly communicated to different I/O modules 26H/28H and/or ARINC modules 26J/28J at one or more levels L1-L4 of the communications hierarchy 42. The I/O and ARINC modules 26H/28H, 26J/28J serve as an access communications point in the communications hierarchy 42 by directly interfacing with the aircraft and control system(s) 30 or components thereof to obtain information relating to the discrete set of inputs.

The discrete set of inputs are defined by each input from the aircraft system 22 to each of the I/O modules 26H/28H, and can be defined by each input from the control systems 30. The I/O modules 26H/28H can directly receive or otherwise obtain one or more of the inputs from the aircraft system(s) 22. The inputs can be indirectly communicated from the respective I/O modules 26H/28H and ARINC modules 26J/28J to other portions of the power distribution system 24. Two or more I/O modules 26H/28H and ARINC modules can directly receive a single input.

Example inputs include one or more electrical signals carried on a single communications line, which can indicate a condition of a component of the aircraft system 22 (e.g., signal from a pressure sensor), for example. An example input can include an ON/OFF switch to control a chiller or aircraft lighting. Control of the chiller may require information relating to a status of airflow to the chiller, which may define another discrete input. Other example inputs include one or more communications messages in a predefined format, such as one or more commands from the control systems 30 (e.g., command from an avionics computer indicating a desired change of operating modes of the system 24).

The I/O modules 26H/28H and ARINC modules 26J/28J can communicate one or more of the inputs to the respective PSCOMMS 26F/28F modules. The modules 26F/28F, 26J/28J define communications routing points in the communications hierarchy 42 and can aggregate and communicate information relating to one or more of the inputs to relatively higher levels L1-L2 and/or disseminate information relating to the input(s) to relatively lower levels L2-L4. The inputs can be communicated to the control module 26FC where the inputs at lower levels L2-L4 are aggregated. It should be understood that although each input of the discrete set of inputs can be aggregated at the first level L1, at least some but not all of the inputs need to be aggregated at relatively higher levels L1-L3 of the communications hierarchy 42.

In the illustrated embodiment of FIG. 5, the PSCOMMS module 28F of each secondary assembly 28 at lower level L2/L3 is subordinate to the communications and control modules 26F, 26FC of one or more of the primary assemblies 26 at the first level L1. Other hardware modules 26D of the primary assembly 26 are arranged at the second level L2 and are subordinate to the communications and control modules 26F, 26FC. For the purposes of this disclosure, the term "subordinate" means that the component is at least partially controlled by another component.

PSCOMMS module 28F at the third level L3 is subordinate to the PSCOMMS module 28F at the second level L2. Other hardware modules 28D of the assembly 28 are arranged at one of the relatively lower levels L3, L4 and are subordinate to the respective PSCOMMS module 28F. For example, the I/O modules 28H can be arranged at third and fourth levels L3, L4 to interface with the aircraft systems 22 or components thereof. One or more ARINC modules 26J/28J can be arranged at any of lower levels L2, L3, L4 to interface with the control systems 30.

Aggregation of the inputs at the higher levels L1-L3 of the communications hierarchy 42 for execution of the operational software 40 by the control module 26FC can significantly increase latency, even though each of the inputs that may be required to perform the logical operation are introduced at relatively lower levels L2-L4 of the communications hierarchy 42. The aggregation of the inputs at higher levels L1-L3 can also increase computational demands on the processor 32 of the primary assembly 26, which may have limited throughput during operation.

One or more logical operations including decision/utility logic that control the respective output module 26G/28G may require inputs from relatively higher levels L1-L3 and/or multiple assemblies 26/28 in the same level L1-L4, including inputs directly communicated to the I/O module 26H/28H of two or more of the assemblies 26/28. The respective inputs can be aggregated at the first level L1, and the logical operations can be executed by the control module 26FC of the primary assembly 26, with the logical operations provided by the operational software 40, for example.

In the illustrated embodiment of FIG. 5, the execution or performance of one or more logical operations that control the output modules 26G, 28G are delegated from the control module 26FC, or are otherwise allocated, to one or more of the hardware modules 26D, 28D according to respective inputs of the discrete set of inputs that define each of the logical operations being at a corresponding level in the communications hierarchy 42. Rather, one or more functions or utilities that may otherwise be provided by the operational software can be integrated in and performed or executed by hardware modules 26D, 28D at relatively lower levels L2-L4 in the communications hierarchy 42 to generate one or more commands to cause the output modules 26G, 28H to selectively power the aircraft systems 22 in response to the respective inputs.

In embodiments, the power distribution assemblies 26/28 execute a plurality of logical operations, and at least a majority of the logical operations of the power distribution assemblies 26/28 that control each respective output module 26G/28G are allocated to a lower level L2-L4 in the communications hierarchy 42 than the level L1 of the control module 26FC of the primary assembly 26. The operational software 40 can be programmed with logic to execute or otherwise perform a remainder of the logical operations to provide a complete set of functionality for the power distribution system 24. In embodiments, the logical operations are levied on the lowest (or a lower) level FPGA(s) 146 in which all required inputs are introduced or are otherwise available, instead of a relatively higher level in the communications hierarchy 42.

Figure 6:
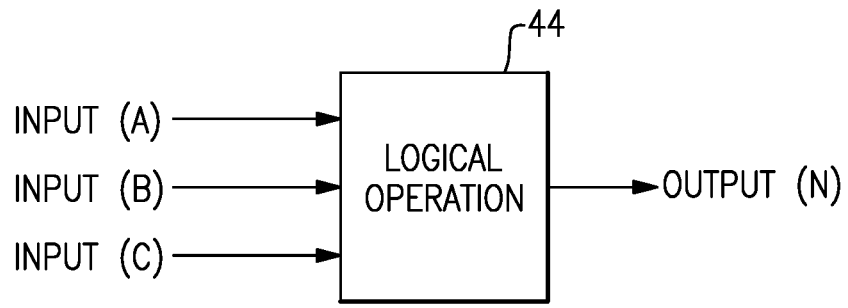
FIG. 6 illustrates a logical operation according to an embodiment.

FIG. 6 illustrates a logical operation 44 according to an embodiment. In the illustrated embodiment, the logical operation 44 is defined by three inputs of the discrete set of inputs including Input(A), Input(B) and Input(C). Although three inputs are disclosed in the illustrated embodiment of FIG. 6, fewer or more than three inputs can define a particular logical operation. The logical operation 44 executes to provide one or more Outputs(N). Each of three inputs can be introduced at a single level L1-L4 (FIG. 5), or more than one of the levels L1-L4.

For example, each of Input(A), Input(B) and Input(C) can be introduced to the I/O module(s) 26H/28H of a single assembly 26/28 at one of the levels L2-L4. The logical operation 44 can be allocated to a hardware component 26D/28D of the same assembly 26/28 such as the PSCOMMS module 26F/28F or the I/O module 26H/28H, or to a hardware component 26D/28D at a relatively higher level L1-L3, independently of aggregating or monitoring Input(A), Input(B) and/or Input(C) at a relatively higher level L1-L3.

In another example, Input(A) can be introduced at level L4, but Input(B) and Input(C) can be introduced to one of the I/O modules 28H at level L3. The logical operation 44 can be allocated to a hardware component 26D/28D of the same assembly 26/28 at level L3 where each of Input(A), Input(B) and Input(C) is aggregated or otherwise available.

In yet another example, Input(A) is introduced at level L3 or L4 to one of the I/O modules 26H/28H, Input(B) is introduced at level L2 by one of the control systems 30 to the ARINC module 28H of the same assembly 26/28, and Input(C) is introduced at level L3 or L4 to the I/O module 28H of another one of the secondary assemblies 28 subordinate to the assembly 26/28. The logical operation 44 can be allocated to a lower or the lowest one of the levels L1-L4 that all of the required inputs to the logical operation 44 are available, such as the PSCOMMS module 28F at level L2 or the control module 26FC of the primary assembly 26 at level L1. For example, Input(B) can be directly communicated to one of the secondary assemblies 26, and Input(C) can be directly communicated to another one of the secondary assemblies 26, with the control module 26FC aggregating the inputs at level L1 and executing the logical operation 44.

Figure 7:
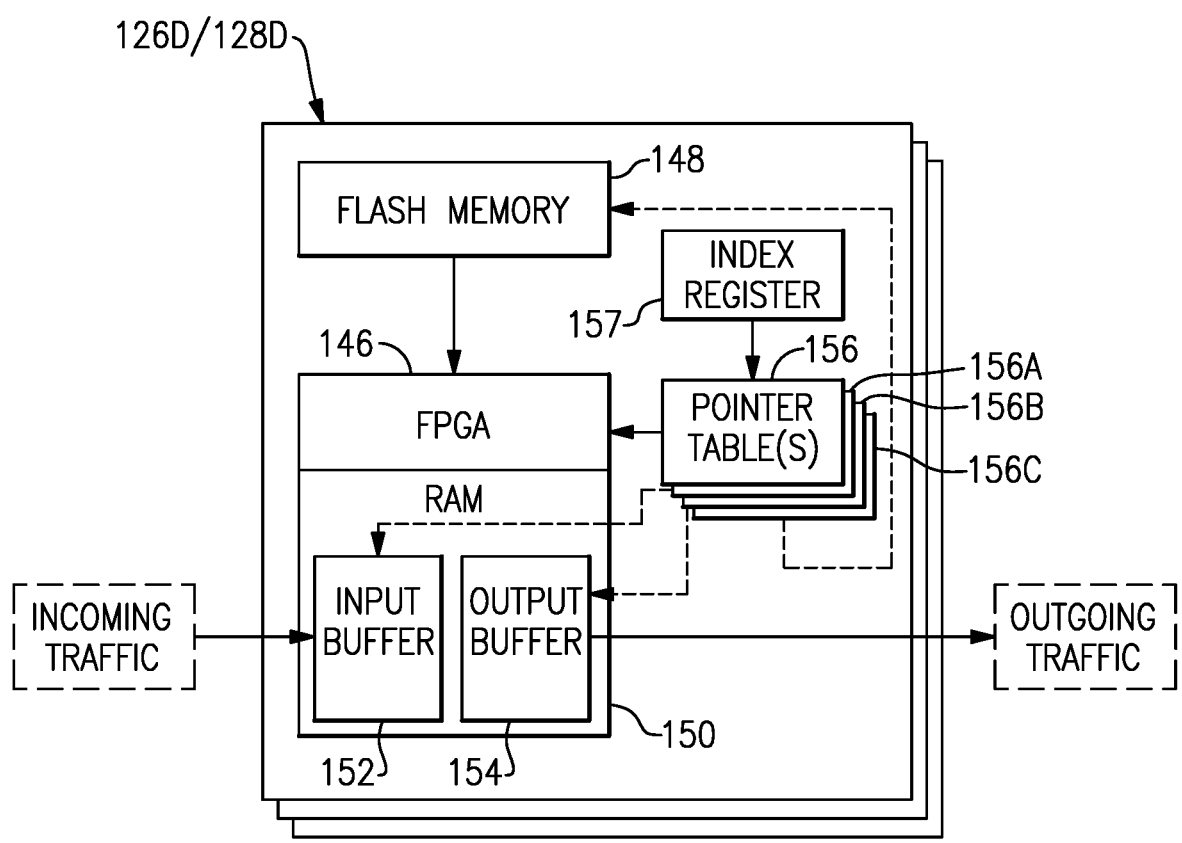
FIG. 7 illustrates a hardware module including a field programmable gate array (FPGA) according to an embodiment.

FIG. 7 illustrates a hardware module 126D/128D according to an embodiment, which can be incorporated into the power distribution system 42. The hardware module 126D/128D includes at least one field programmable gate array (FPGA) 146 that is operable to execute one or more logical operations or decision/utility logic, including one or more logical operations allocated to level L1 or one of the lower levels L2-L4 (FIG. 5). FPGAs are an integrated circuit including an array of programmable logic blocks and reconfigurable interconnects that allow the logic blocks to coupled together in different configurations to define one or more logical expressions such as AND and XOR logic gates, as known. Configuration of the FPGAs can be specified using a hardware description language (HDL), for example.

The FPGA 146 is operable to execute one or more logical operations or decision/utility logic corresponding to inputs of the discrete set of inputs at a corresponding level L1-L4 in the communications hierarchy 42 of the hardware module 126D/128D, including commanding or otherwise causing the respective output module(s) 26G/28G to selectively power the aircraft system(s) 22 or components thereof. The hardware module 126D/128D can be incorporated into one or more of the hardware module 26D/28D of the assemblies 26/28 to reduce latency in the communications hierarchy 42 and computational demand on the control module 26FC, such as one of the PSCOMMS modules 26F/28F, ARINC modules 26J/28J, and/or I/O modules 26H/28H. In alternative embodiments, the functionality of the FPGA 146 is executed by a processor, such as a microprocessor, that executes the logical operations from memory.

The hardware module 126D/128D includes flash memory 148 or another persistent memory that stores one or more parameters relating to the power distribution system 42 and decision/utility logic to control the respective FPGA 146. The FPGA 146 is operable to execute the logical operation(s) according to the parameters. Example parameters include a desired configuration of the interconnects of the FPGA 146 to provide the corresponding logical operations. The parameters and decision/utility logic can be reconfigured and loaded to provide the desired solution for the assembly or system incorporating the FPGA 146, including changes in the system architecture and respective communications hierarchy.

The hardware module 126D/128D includes random access memory (RAM) 150 that defines an input buffer 152 and an output buffer 154. The input buffer 152 is operable to store incoming traffic or other information corresponding to the input(s) that define or are required by the logical operation(s). The output buffer 154 is operable to store outgoing traffic or other information output from the logical operation(s), including one or more commands or other information that control the respective output module(s) 26G/28G to selectively power one or more aircraft systems 22 (FIG. 3). The FPGA 146 is coupled to, or is otherwise operable to access, the RAM 150 to read and/or write data.

The FPGA 146 picks up or reads information in the input buffer 152 and stores information in the output buffer 154 according to one or more pointer tables 156 to command or otherwise cause the respective output module(s) 26G/28G to selectively power the aircraft system(s) 22 or components thereof according to information in the output buffer 154. The pointer tables 156 can be loaded at run-time. The FPGA 146 is operable to pull in one or more pointers defined by the pointer tables 156 at a time. The pointer tables 154 can also include pointers to the respective decision/utility logic in flash memory 148 to configure the FPGA 146 for processing incoming traffic. For example, the pointer tables 154 could include input table(s) 156A pointing to inputs, output table(s) 156B pointing to outputs, and logic table(s) 156C pointing to the logic to be performed on the inputs to achieve the outputs. Operation of this system could be performed using "pseudo-code" for the logic that the FPGA 146 interprets and executes when pointed to by the logic tables 156C that reference the respective decision/utility logic in flash memory 148. Thus, an index register 157 could point to a base-indexed set of locations, including one for the inputs, one for the logic pseudo-code that operates on the inputs, and one for the outputs that the results are sent to. All this could be done by the FPGA 146 automatically stepping through the tables 154A, 154B, 154C using the incremented index pointer of the index register 157 and the three base registers for the inputs, logic, and outputs.

In embodiments, the power distribution system 24 includes hardware module 126D/128D and a plurality of FPGAs 146 at two or more levels of the communications hierarchy 42, including any of levels L1-L4. Each FPGA 146 is operable to execute at least some logical operations allocated to lower levels L2-L4 of the communications hierarchy 42.

Figure 8:
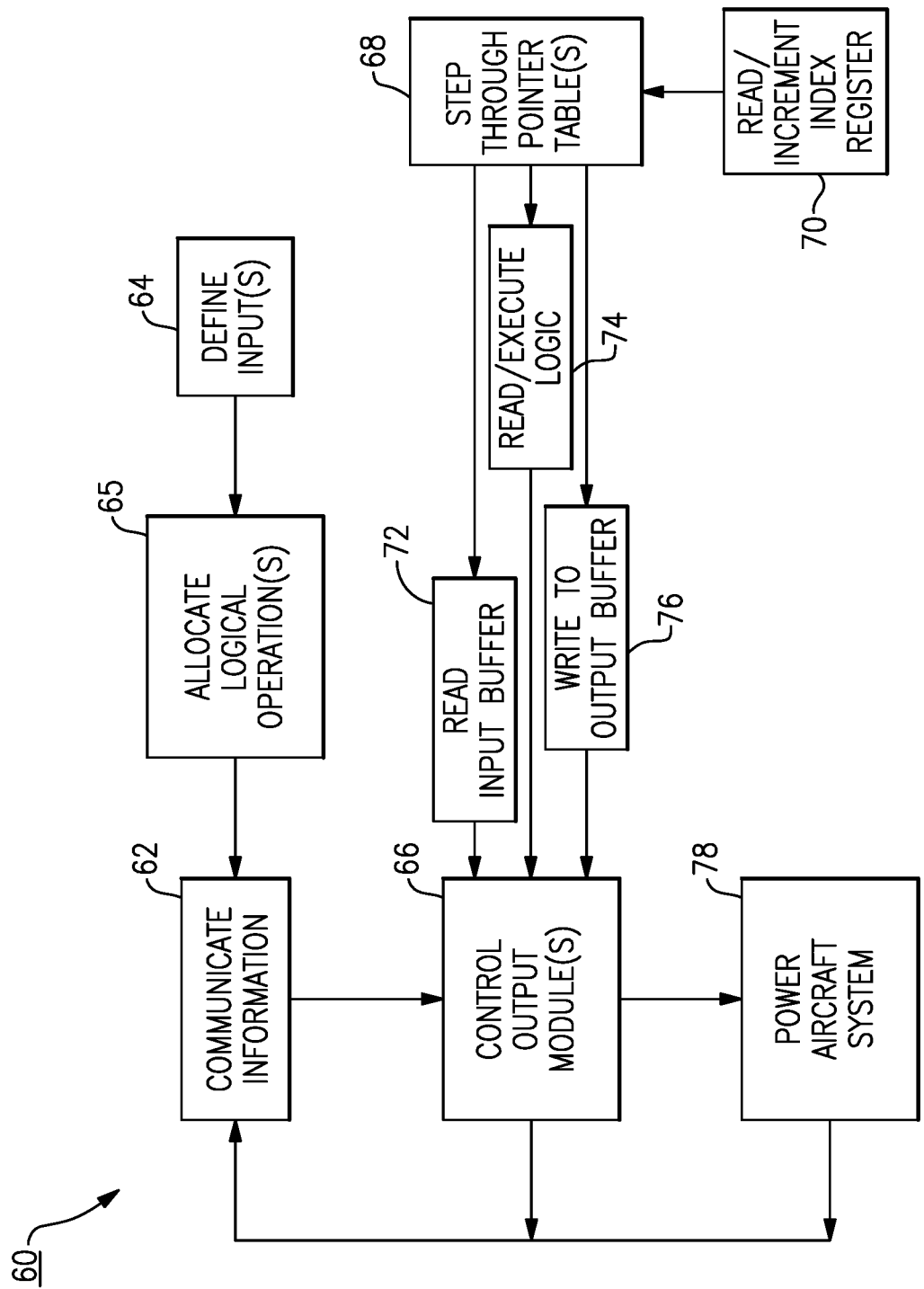
FIG. 8 illustrates a process for operating and configuring a power distribution system according to an embodiment.

FIG. 8 illustrates an algorithm in a flowchart 60 for operation and configuration of a power distribution system for a vehicle such as aircraft, according to an embodiment. The algorithm can be utilized with the power distribution system 24 and/or any of the assemblies 26/28 disclosed herein. At step 62, information corresponding to a discrete set of inputs is communicated to a plurality of power distribution assemblies arranged according to a communications hierarchy. At step 64, the discrete set of inputs are defined by a plurality of aircraft systems and/or control systems of an aircraft, including any of the aircraft systems and control systems disclosed herein, with subsets of the inputs introduced to different hardware modules and/or power distribution assemblies of the power distribution system at one or more levels of the communications hierarchy.

At step 65, one or more logical operations that control output modules are allocated to one or more hardware modules of the power distribution assemblies according to inputs of the discrete set of inputs that define the logical operation(s) being introduced at a corresponding level in the communications hierarchy.

At step 66, the logical operation(s) execute to output information such as one or more commands to control or otherwise cause the output module(s) of the power distribution assemblies to selectively power or control the aircraft system(s) or components thereof. In embodiments, step 66 includes stepping through the pointer table(s), such as input, output and logic tables 156A, 156B and 156C (FIG. 7) at step 68. Step 68 can include reading the index pointer in the index register, such as index register 157, at step 70. Step 70 can include incrementing the index register to point to subsequent locations in the pointer table(s). Step 66 includes reading information corresponding to the inputs in an input buffer according to the one or more pointer tables at step 72, reading and executing pseudo-code for the logic that the FPGA 146 interprets and executes pointed to by the logic table(s) at step 74, storing or writing information in an output buffer according to the pointer table(s) at step 76, and controlling or powering a respective one of the aircraft systems according to the information in the output buffer at step 78. The pointer tables can be arranged to automatically route information relating to the respective inputs through the FPGAs.

The techniques disclosed herein, including allocating one or more logical operations or decision/utility logic to relatively lower levels of the communications hierarchy 42 defined by the power distribution system 24 and executing at least some of the logical operations with FPGA(s) 146 and/or other processor(s) can reduce bottlenecks and latency in the communications hierarchy 42 that may otherwise occur due to aggregation and communication of each input at higher levels of the communications hierarchy 42. The techniques herein can also reduce computational demands on the primary assembly 26 including the processor(s) 32 of the control module 26FC that may otherwise result from executing most or all of the logical operations at the primary assembly 26 or uppermost level of the communications hierarchy 42, which can increase processing speeds, and reduce the need for relatively higher powered processors and reduce overall costs of the system 24.

Although the different examples have the specific components shown in the illustrations, embodiments of this disclosure are not limited to those particular combinations. It is possible to use some of the components or features from one of the examples in combination with features or components from another one of the examples.

Although particular step sequences are shown, described, and claimed, it should be understood that steps may be performed in any order, separated or combined unless otherwise indicated and will still benefit from the present disclosure.

The foregoing description is exemplary rather than defined by the limitations within. Various non-limiting embodiments are disclosed herein, however, one of ordinary skill in the art would recognize that various modifications and variations in light of the above teachings will fall within the scope of the appended claims. It is therefore to be understood that within the scope of the appended claims, the disclosure may be practiced other than as specifically described. For that reason the appended claims should be studied to determine true scope and content.

What is claimed is:

1. A power distribution assembly comprising:
    a housing at least partially receiving a plurality of hardware modules coupled to a backplane, the plurality of hardware modules including at least one output module and a communications module that communicates information between the plurality of hardware modules and a second power distribution assembly that define a communications hierarchy including a plurality of distinct levels;
    wherein at least one hardware module of the plurality of hardware modules includes a field programmable gate array that commands the at least one output module to selectively power at least one aircraft system;
    wherein the at least one hardware module includes random access memory that defines an input buffer and an output buffer, the input buffer storing information corresponding to the inputs of a discrete set of inputs, the field programmable gate array reads information in the input buffer and stores information in the output buffer according to one or more pointer tables to command the output module;
    wherein the field programmable gate array executes logical operations allocated to the at least one hardware module and that correspond to inputs of the discrete set of inputs at a corresponding level in the communications hierarchy;
    wherein the communications hierarchy is defined such that the communications module is subordinate to the second power distribution assembly in the communications hierarchy, and other hardware modules of the plurality of hardware modules are subordinate to the communications module in the communications hierarchy; and
    wherein the at least one aircraft system includes a plurality of aircraft systems defining the discrete set of inputs introduced at one or more lower levels of the plurality of levels of the communications hierarchy and aggregated at relatively higher levels of the plurality of levels of the communications hierarchy.

2. The power distribution assembly as recited in claim 1, wherein the at least one hardware module includes an input module that directly receives one or more inputs of the discrete set of inputs from a respective aircraft system of the plurality of aircraft systems.

3. The power distribution assembly as recited in claim 2, wherein the at least one hardware module includes the input module.

4. The power distribution assembly as recited in claim 1, wherein the one or more pointer tables includes a first pointer table associated with the input buffer and a second pointer table associated with the output buffer.

5. The power distribution assembly as recited in claim 4, wherein the at least one hardware module includes flash memory, with the field programmable gate array operable to execute the logical operations according to one or more parameters stored in the flash memory.

6. The power distribution assembly as recited in claim 5, wherein the field programmable gate array executes the logical operations according to a third pointer table of the one or more pointer tables that references pseudo-code logic in the flash memory that operates on the inputs.

7. A power distribution system for an aircraft comprising:
    at least one primary power distribution assembly;
    a plurality of secondary power distribution assemblies coupled to the at least one primary power distribution assembly and to a plurality of aircraft systems, each of the secondary power distribution assemblies including a plurality of hardware modules, the hardware modules including a communications module, an input module and an output module that selectively powers at least one of the aircraft systems;
    wherein the power distribution system is arranged according to a communications hierarchy including a plurality of distinct levels, with the communications module interconnecting the at least one primary power distribution assembly and the hardware modules, and with a discrete set of inputs defined by each input from the plurality of aircraft systems to each input module;
    wherein a plurality of logical operations that control each output module are allocated to one or more of the hardware modules according to respective inputs of the discrete set of inputs that define each of the logical operations being at a corresponding level of the plurality of levels in the communications hierarchy;
    wherein the at least one primary power distribution assembly includes memory and a processor that executes one or more of the logical operations requiring inputs of the discrete set of inputs directly communicated to the input module of two or more of the secondary power distribution assemblies;
    wherein the communications hierarchy is defined such that the communications module is subordinate to the second power distribution assembly in the communications hierarchy, and other hardware modules of the plurality of hardware modules are subordinate to the communications module in the communications hierarchy; and
    wherein at least a majority of the logical operations of the power distribution assembly that control each output module are allocated to a lower level of the plurality of levels in the communications hierarchy than a respective level of the at least one primary power distribution assembly in the communications hierarchy.

8. The power distribution system as recited in claim 7, wherein at least one hardware module of the plurality of hardware modules includes a field programmable gate array operable to execute respective logical operations of the plurality of logical operations allocated to the at least one hardware module.

9. The power distribution system as recited in claim 7, further comprising a plurality of field programmable gate arrays at two or more levels of the plurality of levels of the communications hierarchy and operable to execute respective logical operations of the plurality of logical operations allocated to the plurality of field programmable gate arrays.

10. The power distribution system as recited in claim 9, wherein each of the field programmable gate arrays is coupled to random access memory defining an input buffer and an output buffer, and each of the field programmable gate arrays reads information corresponding to the respective inputs in the input buffer and stores information in the output buffer according to one or more pointer tables, the respective aircraft system selectively powered according to the information in the output buffer.

11. The power distribution system as recited in claim 10, wherein each of the field programmable gate arrays includes flash memory, is operable to execute the respective logical operations according to one or more parameters stored in the flash memory, and is operable to execute the respective logical operations according to a third pointer table of the one or more pointer tables that references pseudo-code logic in the flash memory that operates on the respective inputs.

12. A method of operation of a power distribution system comprising:

communicating information from a communications module to a plurality of power distribution assemblies arranged according to a communications hierarchy including a plurality of distinct levels, the information corresponding to a discrete set of inputs defined by a plurality of aircraft systems; and controlling output modules of the power distribution assemblies to selectively power the aircraft systems, with one or more logical operations that control the respective output modules being allocated to a plurality of hardware modules of the power distribution assemblies according to inputs of the discrete set of inputs that define the one or more logical operations being at a corresponding level of the plurality of levels in the communications hierarchy, the plurality of hardware modules including the communications module; and wherein the plurality of power distribution assemblies include a primary power distribution assembly at an upper level of the plurality of levels of the communications hierarchy, and includes a plurality of secondary power distribution assemblies at a relatively lower level of the plurality of levels of the communications hierarchy comprising the plurality of hardware modules; and wherein the communications hierarchy is defined such that the communications module is subordinate to the second power distribution assembly in the communications hierarchy, and other hardware modules of the plurality of hardware modules are subordinate to the communications module in the communications hierarchy.

13. The method as recited in claim 12, wherein each of the one plurality of hardware modules includes a field programmable gate array that execute the one or more logical operations.

14. The method as recited in claim 12, wherein each of the plurality of hardware modules includes an input module that directly receives one or more inputs of the discrete set of inputs from the aircraft systems.

15. The method as recited in claim 12, wherein the step of controlling includes reading information corresponding to the inputs in an input buffer and storing information in an output buffer according to one or more pointer tables, and controlling a respective one of the aircraft systems according to the information in the output buffer.

* * * * *